(12) United States Patent
Olesen et al.

(10) Patent No.: US 7,339,788 B2
(45) Date of Patent: Mar. 4, 2008

(54) COOLING UNIT AND FLOW DISTRIBUTING ELEMENT FOR USE IN SUCH UNIT

(75) Inventors: Klaus Kristen Olesen, Soenderborg (DK); Ronald Eisele, Surendorf (DE); Steen Lauridsen, Nordborg (DK)

(73) Assignee: Danfoss Silicon Power GmbH, Schleswig (DK)

( * ) Notice: Subject to any disclaimer, the term of this patent is extended or adjusted under 35 U.S.C. 154(b) by 318 days.

(21) Appl. No.: 10/512,902

(22) PCT Filed: May 7, 2003

(86) PCT No.: PCT/DK03/00303

§ 371 (c)(1),
(2), (4) Date: Mar. 30, 2005

(87) PCT Pub. No.: WO03/095922

PCT Pub. Date: Nov. 20, 2003

(65) Prior Publication Data

US 2005/0180104 A1    Aug. 18, 2005

(30) Foreign Application Priority Data

May 8, 2002    (DK) ............................... 2002 00706

(51) Int. Cl.
*H05K 7/20*    (2006.01)
*F28F 7/00*    (2006.01)

(52) U.S. Cl. ..................... 361/699; 165/80.4

(58) Field of Classification Search ............... 165/80.4; 361/699
See application file for complete search history.

(56) References Cited

U.S. PATENT DOCUMENTS

| | | | |
|---|---|---|---|
| 4,079,416 A | | 3/1978 | Faani et al. |
| 5,159,529 A | * | 10/1992 | Lovgren et al. ............ 361/699 |
| 5,269,372 A | | 12/1993 | Chu et al. |
| 5,801,924 A | * | 9/1998 | Salmonson ................. 361/719 |
| 5,841,634 A | | 11/1998 | Visser |
| 6,052,284 A | * | 4/2000 | Suga et al. ................. 361/699 |
| 6,305,464 B1 | * | 10/2001 | Smalen et al. ............. 165/80.3 |
| 6,388,317 B1 | | 5/2002 | Reese |
| 6,414,867 B2 | * | 7/2002 | Suzuki et al. ............... 363/141 |
| 6,578,626 B1 | * | 6/2003 | Calaman et al. ........... 165/80.4 |
| 7,177,153 B2 | * | 2/2007 | Radosevich et al. ........ 361/699 |
| 2001/0050162 A1 | | 12/2001 | Valenzuela |

FOREIGN PATENT DOCUMENTS

| | | |
|---|---|---|
| DE | 19831282 | 1/2000 |
| EP | 1331665 | 7/2003 |

\* cited by examiner

*Primary Examiner*—Gregory D Thompson
(74) *Attorney, Agent, or Firm*—McCormick, Paulding & Huber LLP (57) ABSTRACT

A liquid-cooled power semiconductor unit has components to be cooled arranged on the upper side of a plate. The bottom side of the plate is cooled by liquid, which is guided along the plate by means of a distributing element, and the liquid inlet and the liquid outlet of the distributing element are preferably arranged perpendicular to the plate. The distributing element is divided into cells, where each cell has a liquid inlet and a liquid outlet perpendicular to the cooled plate, and the distributing element has multiple cells along the plate.

16 Claims, 6 Drawing Sheets

COOLING UNIT AND FLOW DISTRIBUTING ELEMENT FOR USE IN SUCH UNIT

CROSS-REFERENCE TO RELATED APPLICATIONS

This application is entitled to the benefit of and incorporates by reference essential subject matter disclosed in International Patent Application No. PCT/DK03/00303 filed on May 7, 2003 and Danish Patent Application No. PA 2002 00706 filed on May 8, 2002.

FIELD OF THE INVENTION

This invention relates to a cooling unit, especially for liquid cooling of power semiconductors, where the component to be cooled is arranged on the upper side of a plate, and where the bottom side of the plate is cooled by a liquid, which is guided along the plate by means of a distributing element, and where the liquid inlet and the liquid outlet of the distributing element are arranged perpendicular to the plate. The invention further relates to a distributing element for use in a cooling element.

BACKGROUND OF THE INVENTION

Semiconductor devices generate heat during their operation, and this heat usually acts to degrade the operation of the semiconductor device. For power semiconductor devices it is necessary to be cooled during operation to maintain acceptable device performance, and for high power semiconductors liquid cooling is often applied.

U.S. Pat. No. 5,269,372 describes a cold plate for cooling power modules. Liquid is let through an inlet to a chamber, in which a manifold distributes the liquid through several holes into a cooling plate exhibiting inlet conduits and return conduits. The plate, preferably manufactured in copper, is divided into a 6×6 cubicle matrix. Between each two cubes, a fluid channel connects an inlet conduit and a return conduit. This solution achieves a reduction in the temperature gradient, but is expensive due to the need for a heat conducting cold plate. Making a cooling construction which avoids the necessity of a cold plate thus is of interest. Further, due to narrow channels and inlets, the flow resistance is high, thus limiting an increase in cooling capacity.

U.S. Pat. No. 5,841,634 discloses a liquid-cooled semiconductor device, like the one this invention relates to. The semiconductors are here placed inside a housing on a wall, which is to be cooled. The device shows a fluid inlet port and a fluid outlet port, and a baffle placed in a chamber inside the housing. The baffle includes a wall separating the chamber into a top- and a bottom portion, and walls separating each portion into compartment. A number of holes in the wall between top- and bottom portion provide fluid communication between the portions. Fluid is let from the inlet port to a first bottom compartment, and then through holes to a first top compartment. In the top compartment the fluid is let along the wall, which is to be cooled, and through holes to a second bottom compartment. From the second bottom compartment the fluid is let to a second top compartment, where it cools another area of the wall, which is to be cooled. After having passed three top compartments the fluid it let to the fluid outlet port, and out of the device. Thus the cooling compartments of the device is connected in a serial manner.

As the fluid passes the first top compartment, the cooling effect from the fluid will have lead to a higher outlet temperature than the inlet temperature. When the fluid then reaches the second top compartment, additional heating of the fluid will take place, and this will lead to a temperature difference on the cooled wall, from fluid inlet port end to fluid outlet port end. As high power semiconductors are very sensitive to temperature variations, and also sensitive to the temperature level, equal cooling conditions for all semiconductors in a power semiconductor device will have a large impact on the lifetime for the device.

Also the serial connection of multiple cooling compartments will have a high flow resistance as a result, leading to a high pressure drop or a low flow rate of the fluid through the cooling device.

It is an object of this invention to improve the cooling conditions of a semiconductor device, whereby a more equal internal temperature is obtained.

It is a further object of this invention to reduce the flow resistance, whereby the flow rate will increase, leading to a higher cooling capacity.

SUMMARY OF THE INVENTION

The object of this invention is achieved with a cooling unit having a distributing element that is divided into cells, where each cell has a liquid inlet and a liquid outlet arranged preferably perpendicular to the plate, the liquid passing one cell only, and where the distributing element has at least two cells for each plate. Hereby liquid will flow into all cells with substantially the same inlet temperature, whereby the cooling conditions for the semiconductors in the device are improved, and a more equal internal temperature is obtained. Additionally the flow resistance is reduced, as liquid only passes one cell on its way through the unit.

In a preferred embodiment of the invention, the side of the distributing element facing away from the plate is provided with separating walls dividing it into a first chamber, which connects all liquid inlets with each other, and a second chamber, which connects all liquid outlets with each other, when the distributing element is mounted on a bottom plate. It is hereby obtained that liquid, by the distributing element itself, is guided from a common inlet port of the device to all the liquid inlets, and from all the liquid outlets to a common outlet port of the device. The geometry of the bottom part of the cooling unit can hereby be formed by a plate element, and the common inlet port and outlet port can be made simply by adding a hole in the structure, leading to the first chamber, and another hole leading to the second chamber.

In one embodiment of the invention, the cooling unit contains more than one of the distributing elements, and has each of the distributing elements arranged perpendicular to the plates. The cooling unit is in this case a base part, which is able to contain a given number of distributing elements and a given number of plates, whereby larger units can be made divided into sections for mounting of the cooled components.

In a specific embodiment of the invention, the liquid flow in each cell along the plate follows passages, which cause a change of direction of the liquid.

Hereby it is obtained that the heat transfer from the plate to the liquid is improved, because the liquid is rotated. In some cases turbulence may occur. The turbulent liquid flow is obtained by narrow liquid passages in each cell, by a pattern of passages that lead to a change of direction in each cell or by a combination of the two.

In another specific embodiment of the invention, the liquid outlet of one cell is adjacent to the liquid inlet of another cell. Hereby it is obtained that the effect of an increase of liquid temperature across one cell is compensated by supplying cold inlet liquid to one cell next to the outlet of another cell.

In yet another specific embodiment of the invention, the size of the area covered by each cell is varied across the distribution unit. Cooling is hereby increased in the areas of the device where the heat generation is largest, or decreased in the areas where heat generation is low.

Preferably the size of the areas covered by each cell is larger along the edges than in the centre of said distribution unit. Hereby it is achieved that the cooling efficiency is kept low along the edges, where the number of semiconductors are low, and the cooling instead is focused on the areas where the numbers of semiconductors are higher.

Cooling can also be increased in specific cells by increasing the number of changes in flowdirection within a cell. More specific, two neighboring cells may cover the same area, but by narrowing the channel width of one cell there will be room for an additional change in flow direction, i.e. an additional separating wall. The narrower the channel, the higher the flow velocity and thus a higher cooling is the result in the specific cell.

In a specific embodiment of the invention the plate is made of a material with a low heat conduction resistance, i.e. high thermal conductivity. The heat transfer from one side of the plate to the other will hereby have a low impact on the total heat transfer resistance, and small temperature variations on the side of the plate facing the distributing element will be equalized on the other side of the plate. This will have an even more equal temperature for the semiconductors as a consequence.

In another specific embodiment of the invention the plate itself is the substrate to which the semiconductors are attached. Heat transfer resistance from a separate intermediate cooling plate is hereby avoided, and the total heat transfer resistance is decreased. A problem particularly arising from direct cooling is the tendency of the plate to bend upwards due to increased heat impact. By mounting across the plate a bridging element made from a material preferably different from the plate, a downward directed force from the bridge is achieved, which will keep the plate in place.

The cooling unit can be shaped in different ways, e.g. bent into a tubular shape hereby fitting into an electric motor housing and saving space. This can be done if sections of the distributing elements are arranged with an angle to each other thus building e.g. a V-shape of the distributing element.

If several distributing elements are used, transition zones inbetween can contain fewer inlets and outlets per square centimeter than neighbouring distributing compartments. Hereby unnecessary pressure loss is avoided.

The invention further concerns a flow distributing element for use in a cooling unit, e.g. a heat exchanger. Manufacturing the distributing element with cells as already described, i.e. cells having a parallel closed flow path inbetween the liquid inlet and the liquid outlet of the cell, a high efficiency exchange between a warm and a cold liquid in the heat exchanger is obtained.

BRIEF DESCRIPTION OF THE DRAWINGS

Now having described the invention in general terms, the invention will be described in details with reference to the drawings, showing.

DETAILED DESCRIPTION OF THE PREFERRED EMBODIMENTS

Figure 1:
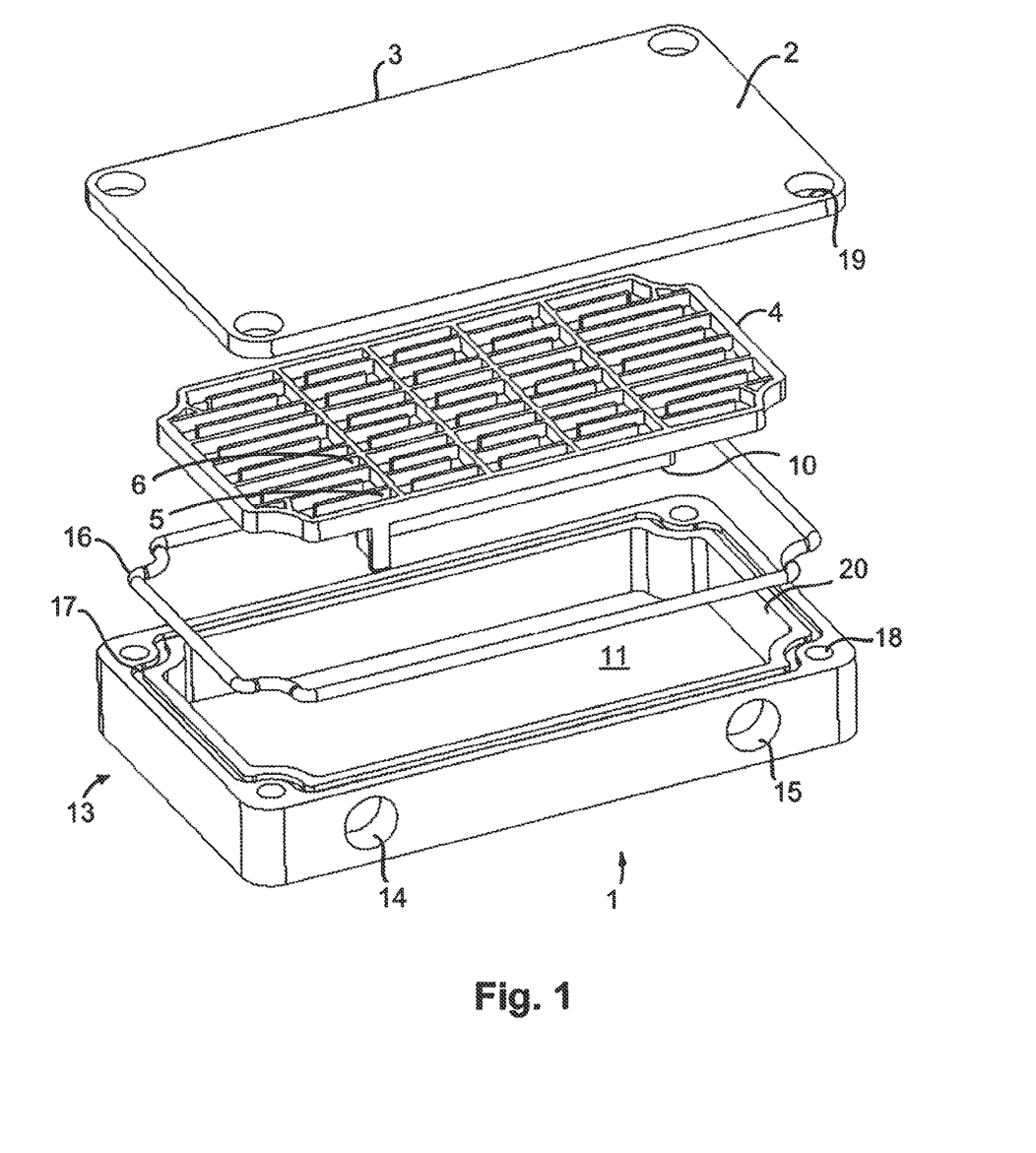
FIG. 1 is an exploded view of a cooling unit.

Turning now to FIG. 1, the cooling unit 1 consists of a bottom part 13, formed as a bathtub with a plane bottom plate 11 and a frame part 20. The bottom part 13 has holes 14 and 15 for liquid connections from a pipe system or the like.

A distributing element 4 fits with the internal surfaces of the frame part 20 of the bottom part 13. When the distributing element 4 is placed in the bottom part 13, it divides this into a top compartment and a bottom compartment. The bottom compartment is formed between the bottom plate 11 and the distributing element 4, and is further divided into two chambers, as will be described later. The holes 14 and 15 is in connection with this bottom compartment, and fluid communication between the bottom compartment and the top compartment will only occur through inlets 5 and outlets 6 in the distributing element 4, described in details later.

A top plate 3 capsulate the top compartment, when it is mounted on the bottom part 13, by means of a sealing ring 16. This sealing ring 16 fits into a groove 17 of the bottom part 13, and seals between the frame part 20 and the top plate 3. The top plate 3 is fixed to the bottom part 13 by means of screws (not shown in the drawings), which through holes 19 in the top plate 3 are screwed into holes 18 of the bottom part 13. The top plate 3 is to be referred to as the cooled plate, since this plate is the one, which is cooled by the liquid led through the unit. On the top of the cooled plate 3 the substrates containing the semiconductors are placed, in a manner that will be obvious to those skilled in the art.

Figure 2:
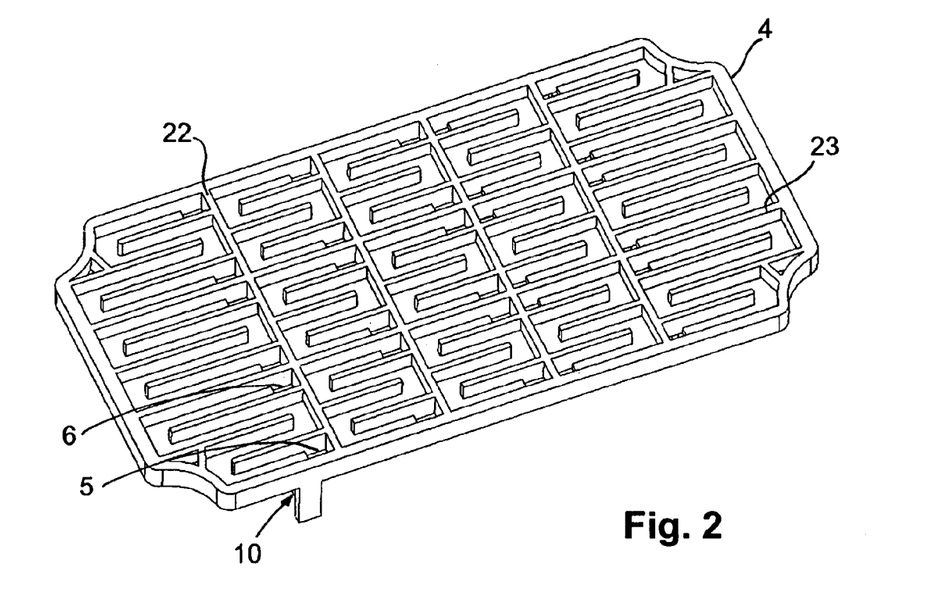
FIG. 2 is a perspective top view of the distributing element.

FIG. 2 shows the distributing element 4, in a perspective view slightly more angled than at FIG. 1. The inlets 5 and outlets 6 are now visible, and the top view of the distributing element 4 in FIG. 3 makes the inlets 5 and outlets 6 even more visible. Liquid inlet from the bottom compartment to the top compartment through the inlets 5, directed by guiding walls 21 along the bottom side of the cooled plate 3 as indicated by arrows on FIG. 3, and let from the top compartment to the bottom compartment through the outlets 6.

Figure 3:
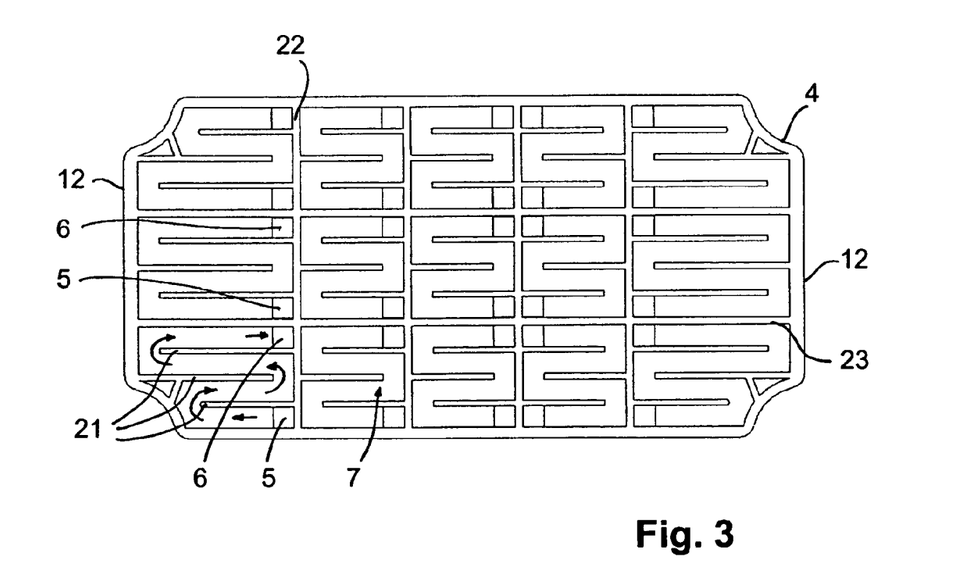
FIG. 3 is a top view of the distributing element.

As will be easily seen in FIG. 3, the guiding walls 21 allow liquid passage at one end of the wall. Some of the walls however run all the way through the structure, like wall 22 and 23. These through-going walls divides the top compartment into cells, each with an inlet 5 and an outlet 6.

The inlet 5 and the outlet 6 are placed such that the outlet of one cell is next to an inlet of another cell. This have the effect that hot liquid, about to leave one cell, is close to cooling liquid, just entered another cell, and heat gradient along the cooled plate is hereby minimized. The heat gradient along the cooled plate is further minimized by varying the size of the area which the cells cover.

Along the edges 12 the area of each cell is larger than on the rest of the surface, whereby the cooling in the area along the edges 12 is less effective than on the rest of the area. As the density of heat generating elements are smaller along the edges of a semiconductor device than on the rest of the device, a decrease in cooling effect along the edges will minimize the heat gradient along the cooled plate.

Returning now to the two chambers of the bottom compartment as mentioned previously, FIG. 4 shows a perspective view of the distributing element from the bottom side. The wall 10, running in a snake-like pattern along the bottom side, will bear on the bottom plate 11 of the bottom part 13, and forms a principally liquid-proof connection. The bottom compartment of the distributing element 4 is hereby divided into an inlet compartment 8, and an outlet compartment 9, when the distributing element is placed in the bottom part. All the inlets 5 are in connection with the inlet compartment 8, and all the outlets 6 are in connection with the outlet compartment 9. The cells of the top compartment, FIGS. 2 and 3, are thus all connected in parallel between the common inlet port and the common outlet port, position 14 and 15 of FIG. 1.

Figure 8:
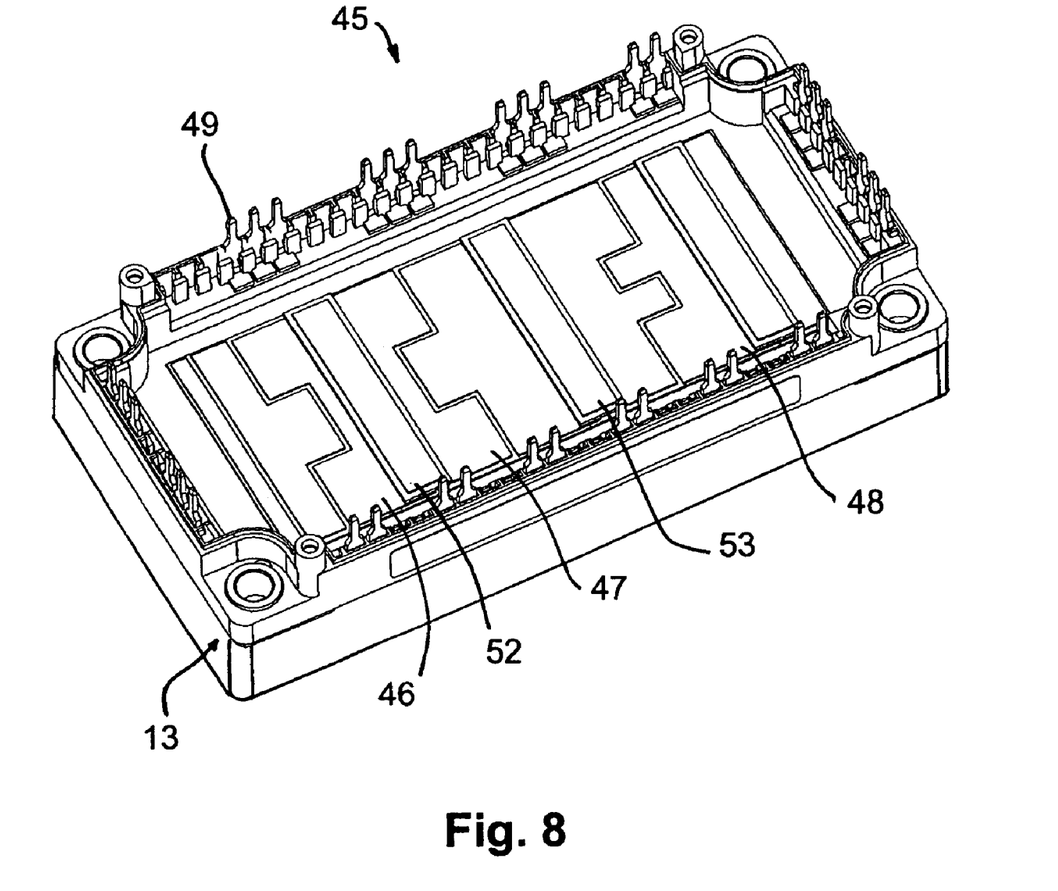
FIG. 8 is a power module with reinforcement bridges.

In the first embodiment of the invention shown in the drawings, the substrate to which the semiconductors are attached is placed on top of the cooled plate 3, in a way known to those skilled in the art. The cooled plate could however be the substrate itself, placed directly as a cover on the cooling unit. This is a consequence of the minimized heat gradient along the cooled plate, which makes the traditional heat spreading plate, shown in FIG. 1 as the cooled plate 3, needless in some applications. FIG. 8 shows an example of a directly cooled power module 45, the top lid being removed. The bottom part 13 incorporates the distributing element 4 (not visible) as shown in FIG. 1, and Direct Copper Bonding substrates (DCBs) 46, 47 and 48 are connected to the housing and to electrical terminals 49 through wire bonds (not shown). The DCBs bear directly against the distributing element. Due to the direct cooling thermal impact is greater, and the DCBs tend to bend upwards with the middle of the DCB attaining the largest degree of bending. To alleviate this problem bridges 52 and 53 preferably consists of a material different from the DCBs and are placed across the DCBs as shown, hereby counteracting the upwards motion of the DCB. By choosing the bridges in another material than the material of the DCBs, a difference in the coefficient of expansion between bridge and DCB is reached, however even a bridge in a material like the DCB will have a counteracting effect. The two ends of each bridge 52 and 53 are preferably fixated by nesting them into openings (not shown) in the housing 54. Alternatively, they can be glued or soldered onto the surface of the DCBs. In this embodiment the power module consists of three independent DCBs, but the bridges can be used for one large DCB also.

Figure 5:
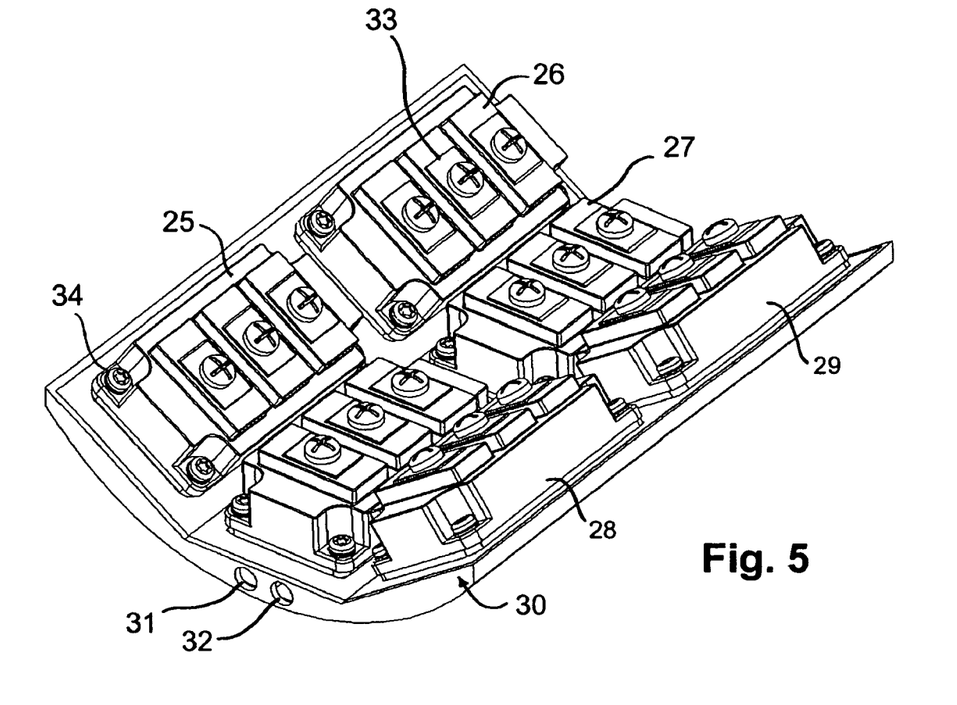
FIG. 5 illustrates a semi tubular cooling unit with power modules mounted.
Figure 6:
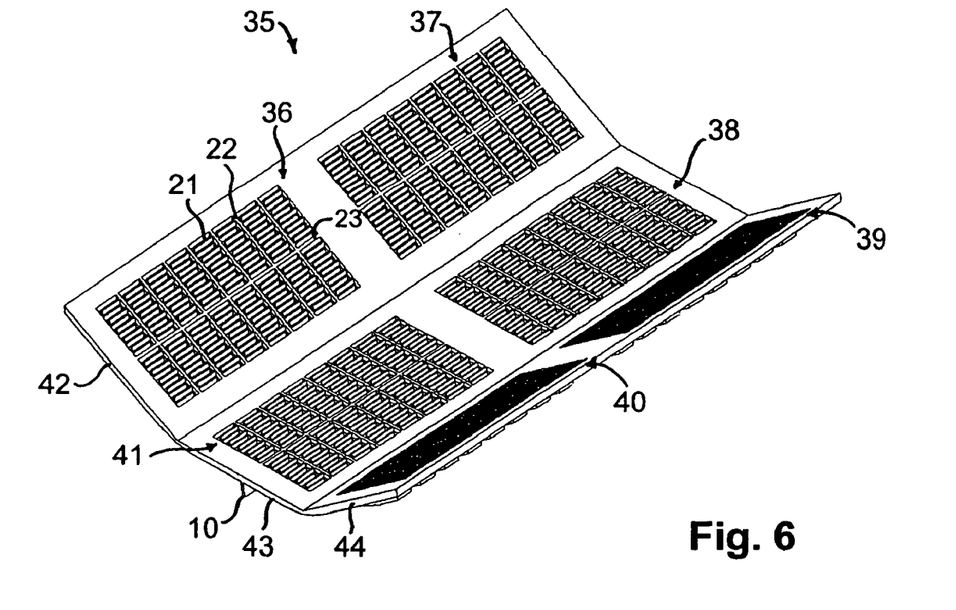
FIG. 6 is a perspective top view of a semi tubular distributing element.
Figure 7:
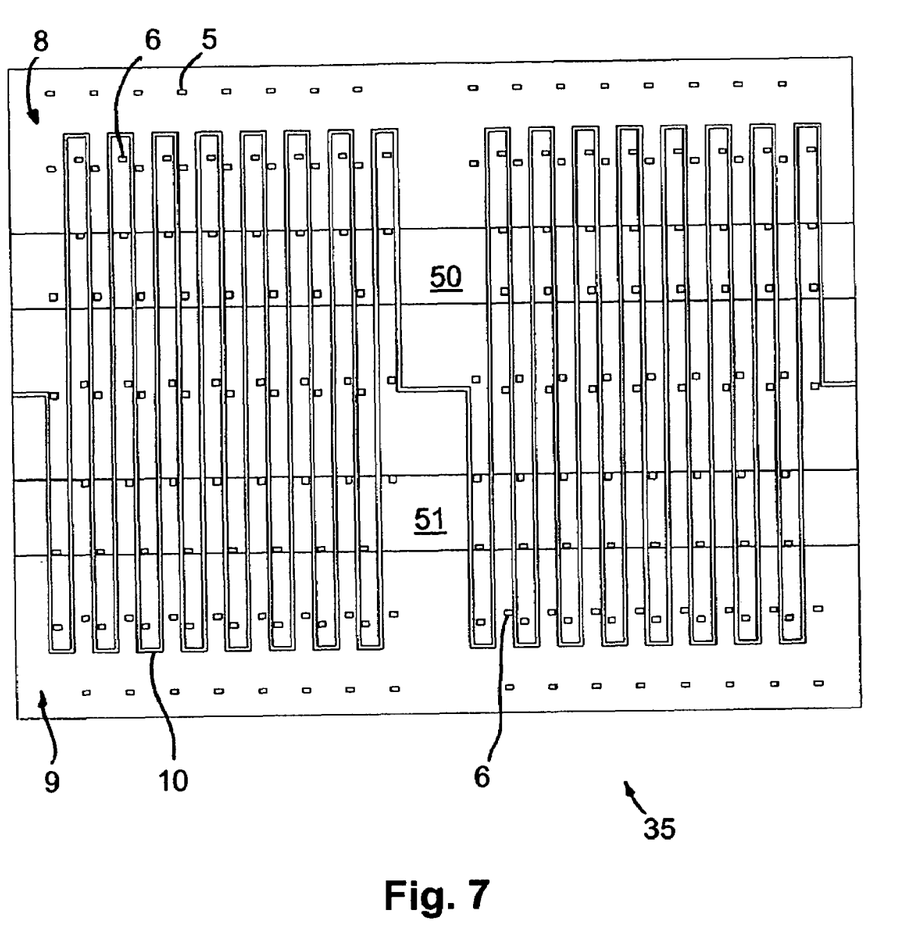
FIG. 7 is a bottom view of the semi tubular distributing element.

The embodiment of the invention shown on the drawings so far is limited to one distributing element 4 placed in a bottom part 13. This shall not limit the invention, as a bottom part with spaces for more than one distributing element 4 easily can be imagined, whereby a single cooling unit cools more than one component, and contains more than one cooled plate. FIG. 5 shows another embodiment of the invention. The cooling unit 30 has got a tubular shape with an inlet 32 and an outlet 31. Mounted on the cooling unit are power modules 25, 26, 27, 28 and 29 with terminals 33 for electrical connection. The power modules are mounted on the cooling unit with screws via holes 34. A tubular cooling unit like the one shown is used in an electrical motor and inserted into the motor in a way, that the side of the cooling unit 30 which has no power modules bears against the inside of the motor housing in order to minimize the space needed. The multi distributing element 35 shown from the top in FIG. 6 is a part of the cooling unit 30 and placed inside, and exhibits guiding walls 21 and through-going walls 22 and 23. In difference to the single distributing element described hitherto, this multi distributing element contains six distributing compartments 36, 37, 38, 39, 40 and 41 corresponding to the number of power modules. However, there is only one liquid inlet and outlet which is common to all five distributors. The multi distributing element is divided into three sections 42, 43 and 44, where sections 42 and 44 are integrally connected to section 43 and defines an obtuse angle to this section. FIG. 7 shows the multi distributing element 35 from the side opposite to the one shown in FIG. 6. The wall 10 divides this side of the distributor into an outlet compartment 9 and an inlet compartment 8. Through inlets 5 cooling liquid enters the meandering channels on the opposite side, and through outlets 6 the warm liquid is diverted away. Though the multi distributer 35 incorporates five distributors, only one separating wall 10 is used. In a transition zone two areas 50 and 51 each occupy a larger area than the other channels. In the transition zone no cooling is needed, because there is no power module on the opposite side. However, the areas 50 and 51 cover areas identical in size in order to avoid unbalancing the temperature distribution. Further, the number of outlets and inlets are reduced in the transition zone as compared to the corresponding areas in the distributing compartments hereby lowering the minimum amount of inlet pressure to the cooling unit.

Figure 4:
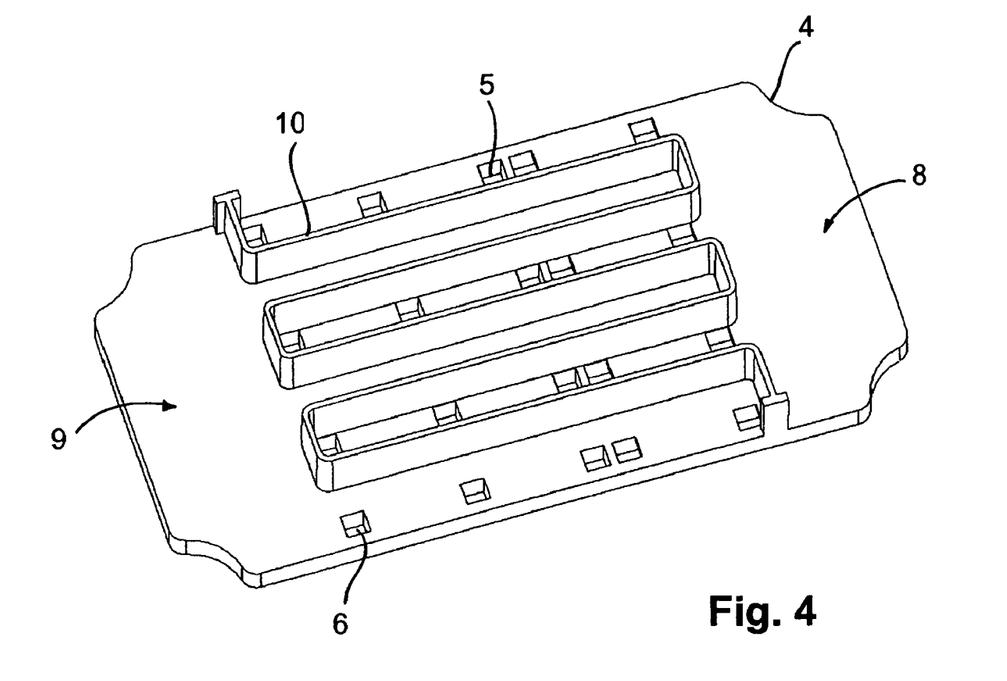
FIG. 4 is a perspective bottom view of the distributing element.

The distributing elements 4 and 35 are preferably manufactured as a pressure die cast hard plastic.

The invention claimed is:

1. A cooling unit, for liquid cooling of power semiconductors, which unit cools component(s) arranged on the upper side of at least one plate, the bottom side of said at least one plate being cooled by a liquid, the cooling unit comprising:
a distributing element for guiding the liquid along said plate, said distributing element being divided into cells, each cell having a liquid inlet and a liquid outlet arranged substantially perpendicular to said plate, the liquid flowing through each of said cells in parallel and said distributing element having at least two cells for said plate.

2. The cooling unit according to claim 1, wherein a side of the distributing element facing away from said plate is provided with at least one separating wall creating a first chamber, which connects all liquid inlets with each other, and a second chamber, which connects all liquid outlets with each other, when said distributing element is mounted on a bottom plate.

3. The cooling unit according to claim 1, wherein the distributing element includes a plurality of distributing compartments.

4. The cooling unit according to claim 1, wherein the liquid flow in each cell follows passages, which cause a change of direction of the liquid.

5. The cooling unit according to claim 1, wherein the liquid outlet of one cell is adjacent to the liquid inlet of another cell.

6. The cooling unit according to claim 1, wherein the size of the area covered by each cell is varied across said distributing element.

7. The cooling unit according to claim 6, wherein the size of the areas covered by each cell is larger along the edges than in the centre of distributing element.

8. The cooling unit according to claim 1, wherein the number of changes in flow direction is larger in one cell than in a neighbouring cell.

9. The cooling unit according to claim 1, wherein the plate is made of a material with a low heat conduction resistance.

10. The cooling unit according to claim 1, wherein said plate is the substrate to which the semiconductors are attached.

11. The cooling unit according to claim 10, wherein at least one bridging element is mounted on the plate, the bridging element exerting a downward directed force on the plate.

12. The cooling unit according to claim 3, wherein the distributing element is divided into sections which are arranged at an angle to each other.

13. The cooling unit according to claim 3, wherein the distributing element has transition zones between neighbouring distributing compartments, the transitions zones having fewer inlets and outlets per unit area than the neighbouring distributing compartments.

14. A flow distributing element for use in a cooling unit, said cooling unit comprising a housing and a separating plate and using fluid cooling whereby heat from a fluid on the first side of the separating plate is extracted and diverted away by another fluid on the second side of the plate, wherein the distributing element is placed against the second side of the plate, that the element exhibits cells, each cell having an inlet and an outlet and a closed flow path therebetween.

15. The flow distributing element according to claim 14 wherein the distributing element comprises at least two cells.

16. The flow distributing element according to claim 14, wherein the inlets and outlets are substantially perpendicular to the plate.

* * * * *